TRANSDUCER

Filed Dec. 1, 1966

United States Patent Office 3,518,508
Patented June 30, 1970

3,518,508
TRANSDUCER
Akio Yamashita, Ikeda-shi, and Masaru Tanaka, Toyonaka-shi, Japan, assignors to Matsushita Electric Industrial Co., Ltd., Osaka, Japan, a corporation of Japan
Filed Dec. 1, 1966, Ser. No. 598,296
Claims priority, application Japan, Dec. 10, 1965, 40/76,822
Int. Cl. H01l *11/00, 15/00*
U.S. Cl. 317—235 4 Claims

ABSTRACT OF THE DISCLOSURE

A pressure responsive transducer is disclosed. The transducer has a body which is composed of a semiconductive material or an insulating material which have been doped with a deep-level impurity. At least two electrical connections are provided to the body, and a means is provided for applying pressure to the body.

Figure 1:
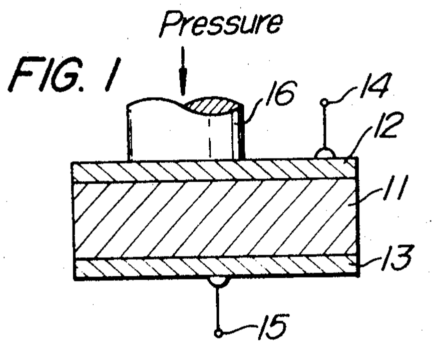

This invention relates to an electric apparatus and more particularly to an electric apparatus for transforming a mechanical signal into an electric signal.

Various kinds of devices for transforming a mechanical signal into an electric signal have been proposed up to the present. They include, for example, a semiconductor device in which the rectification characteristic of the p-n junction of the semiconductor changes when pressure is applied to the p-n junction. Such a semiconductor device is fabricated by forming a p-n junction at a shallow position from the surface. In such a device, both forward and reverse current increases are obtained when pressure is applied to said junction surface. Further, if pressure is applied to a p-n junction having tunnel effect, a negative resistance characteristic due to tunnel effect may be changed.

The reason that the current-voltage characteristic of the p-n junction may be altered with pressure as described above is considered to be either that generation-recombination centers are formed at the junction when pressure is applied or that the width of the forbidden band of the semiconductor narrows due to pressure.

Recently it was found that the life-time of free carriers changes with pressure and this fact suggests that the former reason is more reasonable. It has been possible up to the present to change only the rectification characteristic or the negative resistance characteristic of a voltage controlled type due to tunnel effect because pressure is applied to the p-n junction as described above. There is another attempt to use thin film of Ge etc. for a strain gauge. This utilizes the piezo-resistance effect of Ge film. None of these devices, however, make use of an impurity forming a deep level and so it has not been possible to control a negative resistance of a current controlled type with pressure.

According to the present invention, there is provided an electric apparatus which is more sensitive to pressure than such conventional devices and in which a negative resistance of a current controlled type may be controlled with pressure, said electric apparatus being characterized in that a solid having a forbidden band like an insulator or a semiconductor is doped with a deep-level impurity, that at least two electric connections for deriving an electric signal are provided in said solid and that a medium for the transmission of pressure is made into contact with an arbitrary position of said solid or said electric connections.

It is an object of the invention to provide an electric apparatus whose resistance may be sensitively changed with pressure.

It is another object of the invention to provide an electric apparatus whose negative resistance characteristic of a current controlled type may be changed with pressure.

It is a further object of the invention to provide an electric apparatus in which the "on" and "off" states thereof may be electrically controlled with pressure.

Figure 2:
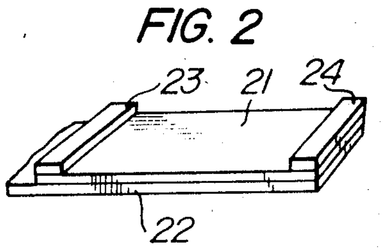
Figure 3:
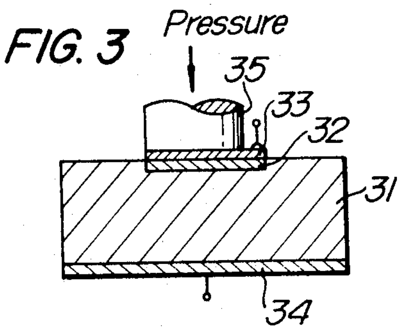
Figure 5:
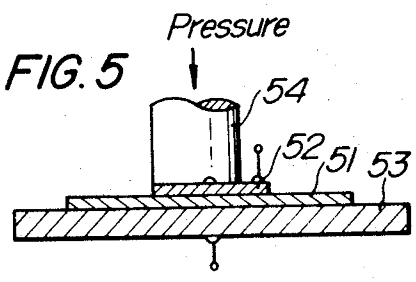
Figure 4:
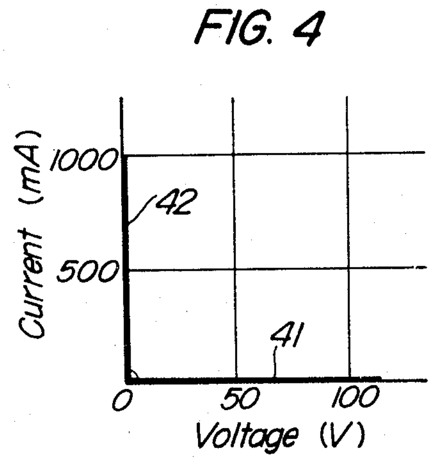
Figure 6:
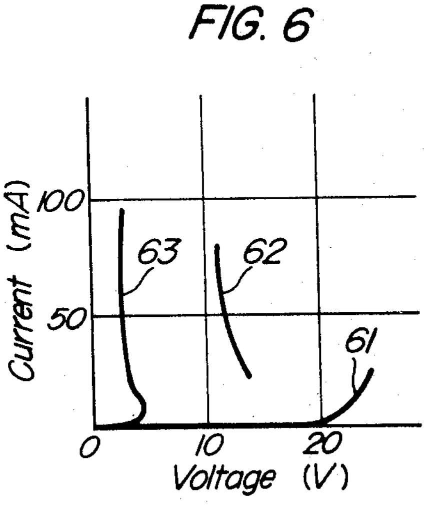

Other objects, features and advantages of the invention will become apparent from the following detailed description of the invention when taken in conjunction with the accompanying drawings, in which:

FIG. 1 is a sectional diagram of an electric apparatus embodying the present invention, FIG. 2 is a perspective view of another electric apparatus embodying the invention, FIG. 3 is a sectional view of a further embodiment of the invention, FIG. 4 is a diagram showing a voltage-current characteristic obtained with the apparatus shown in FIG. 3, FIG. 5 is a sectional view of a yet further embodiment of the invention, and FIG. 6 shows a voltage-current characteristic obtained with the device shown in FIG. 5.

In FIG. 1, which illustrates the principle of the structure of an electric apparatus according to the invention, reference numeral 11 designates a solid having a forbidden band like an insulator or a semiconductor, said solid being doped with deep-level impurity. Reference numerals 12 and 13 denote parts electrically connected to said solid 11 and 14 and 15 designate electrode terminals derived therefrom and 16 indicates a medium for transmitting pressure.

As the solid 11, a known semiconductor like Ge, Si, GaAs, CdS, InSb, CdTe etc. or an insulator having a forbidden band like $SiO_2$, SiO, inorganic film insulator etc. may be used. Said solid is doped with a deep-level impurity. It is advisable to use an element like Cu, Fe, Ni, Co, Mn, Au, etc. as the impurity when a semiconductor is used and to use an element whose valence is quite different from that of the metal atom composing an oxygen defect or an oxide when an oxide like $SiO_2$, SiO, etc. is used. For doping an inorganic film with the impurity, it is sufficient, for example, to add a metal element to the molecules in the stage of chemical reaction, like polymerization reaction. There are many ways of providing electric connections to the solid doped with a deep-level impurity. Namely, according to one method metal is simply made to contact with the solid 11. According to another method an n-type region wherein electrons perform electric conduction is formed in the solid 11 and an electrode is derived from said n-type region. According to still another method, contrary to the above method, a p-type region, wherein holes perform electric conduction, is formed and an electrode is derived from said p-type region. Said electric connections may be provided at arbitrary positions on the solid and the number thereof is arbitrary only if it is assured that it is more than two.

The medium 16 for transmitting pressure to the solid 11 must be in contact with the solid 11. This medium 16 may be placed at any position on the surface of the solid and said medium is allowed to be in contact with said electric connection. There may be used as said medium 16 for the transmission of pressure either gas like air, liquid like water, oil etc. or a solid like metal, ceramic, glass, etc. Said medium may be simply insulated from the other electric connection or said medium may be used as electrode at the same time when metal is used as the medium.

Now, the principle of an electric apparatus according to the invention will be described.

It was found to be likely from the detailed investigation by the present inventors that if a solid includes a deep-level impurity, generation-recombination centers are easily formed in the solid when pressure is applied. Therefore, if more than two electric connections are provided to the solid as described above, the electric variation due to pressure may be derived therefrom. Accordingly, if pressure is applied to the solid, the electric resistance decreases and if an intense electric field is applied to the solid at the same time, avalanche phenomenon is likely to occur and so switching action may be obtained.

Now, the present invention will be further described with reference to various electric apparatuses embodying the invention.

(1) After Ge semiconductor is doped with an impurity like Cu, Fe, Au, etc., it is vacuum evaporated upon an elastic insulating substrate like a plastic film or an insulator-coated metal substrate. Then, as is shown in FIG. 2, two metal electrodes are provided on the evaporated Ge film by vacuum evaporation. Namely, in FIG. 2, 21 denotes the evaporated Ge film doped with a deep-level impurity, 22 the substrate and 23 and 24 the electrodes. Now, if pressure is applied to the substrate 22, resistance variation appears in the evaporated Ge film 21 and it causes the resistance between the electrodes 23 and 24 to change. Thus a mechanical signal may be transformed into an electric signal. It is characteristic of this device that the device is quite sensitive to pressure because a deep-level impurity is included in Ge. In this case, Ge may be doped with said deep-level impurity according to a known method in which the impurity is thermally diffused into a high purity Ge crystal. It is advisable to use metal like Rh or Au for the electrode. The sensitivity to pressure of the electric apparatus according to the invention is improved by factor 10–100 in comparison with conventional devices which do not use Ge including a deep-level impurity.

(2) A bulk of Si single crystal is doped with an impurity like Cu, Au, Co, Fe, Ni, etc. according to a known diffusion method. Then a metal electrode and an alloy junction, which are in ohmic contact with each other, are formed to provide a region having a low specific resistance and another metal electrode in ohmic contact with said region is provided. Further, a pressure medium for applying pressure to the alloy junction surface is put into contact with a suitable position of the electrode. FIG. 3 shows an example of the electric apparatus fabricated by the method described above, wherein 31 designates a Si single crystal bulk doped with a deep-level impurity, 32 a layer having, for example, an n-type conduction, 33 a metal electrode of Au (0.8% Sb) in ohmic contact with said n-type layer 32 and 34 denotes another electrode which is made of Al when the Si bulk is diffused with Cu to form a p-type bulk and which is made of Au (0.8% Sb) when the bulk is of n-type. 35 is a pressure medium formed of glass. The voltage (V)-current (I) characteristic of such an electric apparatus is shown in FIG. 4, in which line 41 indicates an "off" state when no pressure is applied and line 42 shows an "on" state when pressure of 50 g./cm.$^2$ is applied. Such a switching characteristic due to the application of pressure is considered to result from the fact that when pressure is applied while a reverse bias is present at the alloy junction, free carriers are easily created and due to these carriers avalanche takes place under the high electric field to cause breakover. Though the alloy junction is used in the above description, any metal capable of being in blocking contact with the Si single crystal doped with Cu (as almost all metals are) may equally be used without changing the effect of the invention.

(3) $SiO_2$ film is formed by vacuum evaporation and an impurity like Au or Cu is diffused thereinto to form deep levels. It is advisable to perform the diffusion in an atmosphere of oxygen. Then a metal electrode is provided opposite to the direction of thickness. Accordingly, $SiO_2$ is evaporated on a substrate of metal like Ta and after Au or Cu is diffused, Al may be evaporated thereon. The structure of the electric apparatus fabricated according to said method is illustrated in FIG. 5. In the figure, 51 is the $SiO_2$ film doped with a deep-level impurity, 52 is the Al electrode evaporated on the $SiO_2$ film, 53 a Ta metal substrate on which the $SiO_2$ film is evaporated and 54 is the pressure medium. FIG. 6 shows a current-voltage characteristic obtained with such an apparatus, wherein curve 61 indicates an "off" state in the absence of pressure and curve 62 indicates an "on" state in the absence of pressure. Curve 63 shows a characteristic obtained when pressure of 30 g./cm.$^2$ is applied. It is characteristic of this apparatus that it exhibits a negative resistance characteristic as shown by curves 61 and 62 when no pressure is applied, but that the holding voltage of the "on" state becomes extremely small as shown by curve 63.

As is fully described hereinabove, there is provided according to the present invention an electric apparatus characterized in that a solid including a forbidden band is doped with a deep-level impurity, that at least two electric connections are provided to said solid and that a pressure medium is in contact with an arbitrary point on the surface of said solid, the electric characteristics thereof like resistance and negative resistance being controllable with pressure. Said apparatus may be applied to a transducer, a push-button switch, a microphone, etc. and it enjoys a wide range of industrial applications.

It is to be noted that though the embodiments comprising two electrodes are described hereinabove, the apparatus comprising more than two electrodes may be used without changing the invention. It is to be noted further that the negative resistance characteristic may be improved if rectifying junctions are used as electric connections.

What is claimed is:

1. A transducer comprising a semiconductor body, said body being doped throughout with an impurity forming a deep-level, at least two electrical connections to said body in which at least one of said electric connections comprises a rectifying junction, and means for transmitting pressure to said body.

2. A transducer according to claim 1, wherein said body is a thin film of semiconductive material placed on an elastic substrate, said substrate being said means for transmitting pressure to said body.

3. A transducer according to claim 2, wherein said electrical connections are on a given surface of said thin film opposite to the substrate.

4. A transducer according to claim 1, wherein the means for transmitting pressure to said body contacts one of said electrical connections.

References Cited

UNITED STATES PATENTS

| | | | |
|---|---|---|---|
| 2,866,014 | 12/1958 | Burns | 317—235 X |
| 3,102,420 | 9/1963 | Mason | 317—234 X |
| 3,132,408 | 5/1964 | Pell | 317—235 X |
| 3,184,347 | 5/1965 | Hoerni | 317—235 X |
| 3,284,750 | 11/1966 | Komatsubara | 307—306 X |
| 3,310,502 | 3/1967 | Komatsubara et al. | 317—235 X |
| 3,314,035 | 4/1967 | Sanchez | 317—234 X |
| 3,372,244 | 3/1968 | Sikorski | 317—235 X |
| 3,387,230 | 6/1968 | Marinace | 317—235 X |
| 3,403,307 | 9/1968 | Rindner | 317—235 |
| 3,427,410 | 2/1969 | Diamond | 317—235 X |
| 3,320,568 | 5/1967 | Russell et al. | 338—2 |

JOHN HUCKERT, Primary Examiner

A. J. JAMES, Assistant Examiner

U.S. Cl. X.R.

307—299, 307; 338—13